United States Patent
Panigrahy et al.

(10) Patent No.: US 7,299,317 B1
(45) Date of Patent: Nov. 20, 2007

(54) ASSIGNING PREFIXES TO ASSOCIATIVE MEMORY CLASSES BASED ON A VALUE OF A LAST BIT OF EACH PREFIX AND THEIR USE INCLUDING BUT NOT LIMITED TO LOCATING A PREFIX AND FOR MAINTAINING A PATRICIA TREE DATA STRUCTURE

(75) Inventors: Rina Panigrahy, Sunnyvale, CA (US); Samar Sharma, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 1277 days.

(21) Appl. No.: 10/165,572

(22) Filed: Jun. 8, 2002

(51) Int. Cl.
*G06F 12/00* (2006.01)
*G06F 13/00* (2006.01)
*G06F 13/28* (2006.01)

(52) U.S. Cl. .......................... 711/108; 365/49
(58) Field of Classification Search ................ 711/108
See application file for complete search history.

(56) References Cited

U.S. PATENT DOCUMENTS

| | | |
|---|---|---|
| 5,088,032 A | 2/1992 | Bosack |
| 5,319,763 A | 6/1994 | Ho et al. |
| 5,481,540 A | 1/1996 | Huang |
| 5,515,370 A | 5/1996 | Rau |
| 5,528,701 A | 6/1996 | Aref |
| 5,651,099 A | 7/1997 | Konsella |
| 5,721,899 A | 2/1998 | Namba |
| 5,740,171 A | 4/1998 | Mazzola et al. |
| 5,781,772 A | 7/1998 | Wilkinson, III et al. |
| 5,809,501 A | 9/1998 | Noven |
| 5,829,004 A | 10/1998 | Au |
| 5,842,040 A | 11/1998 | Hughes et al. |
| 5,848,416 A | 12/1998 | Tikkanen |
| 5,884,297 A | 3/1999 | Noven |
| 5,898,689 A | 4/1999 | Kumar et al. |
| 5,920,886 A | 7/1999 | Feldmeier |

(Continued)

OTHER PUBLICATIONS

Donald R. Morrison, "PATRICIA—Practical Algorithm to Retrieve Information Coded in Alphanumeric," Journal of the ACM, vol. 15, No. 4, Oct. 1968, pp. 514-534.

(Continued)

*Primary Examiner*—Matthew Kim
*Assistant Examiner*—Edward J Dudek
(74) *Attorney, Agent, or Firm*—The Law Office Of Kirk D. Williams

(57) ABSTRACT

Methods and apparatus are disclosed for maintaining and using entries in one or more associative memories. A last bit of a prefix is checked, and based on this result, the entry is placed into one of two classes of associative memory entries. The entry can then be identified within the associative memory by performing a lookup operation using the prefix padded with ones if the last bit of the prefix is zero or with zeros if the last bit is one to fill out the remaining bits of the lookup word. Entries of different classes of entries are typically either stored in different associative memories, or in the same associative memory with each of these entries including a class specific identifier. Among other applications, these entries can be used to locate a prefix and to store a tree data structure in the one or more associative memories.

39 Claims, 12 Drawing Sheets

U.S. PATENT DOCUMENTS

| | | | |
|---|---|---|---|
| 5,930,359 | A | 7/1999 | Kempke et al. |
| 6,000,008 | A | 12/1999 | Simcoe |
| 6,018,524 | A | 1/2000 | Turner et al. |
| 6,061,368 | A | 5/2000 | Hitzelberger |
| 6,067,574 | A | 5/2000 | Tzeng |
| 6,091,725 | A | 7/2000 | Cheriton et al. |
| 6,097,724 | A | 8/2000 | Kartalopoulos |
| 6,115,716 | A | 9/2000 | Tikkanen et al. |
| 6,141,738 | A | 10/2000 | Munter et al. |
| 6,148,364 | A | 11/2000 | Srinivasan et al. |
| 6,219,748 | B1 | 4/2001 | Srinivasan et al. |
| 6,236,658 | B1 | 5/2001 | Essbaum et al. |
| 6,237,061 | B1 | 5/2001 | Srinivasan et al. |
| 6,240,485 | B1 | 5/2001 | Srinivasan et al. |
| 6,243,667 | B1 | 6/2001 | Kerr et al. |
| 6,285,378 | B1 | 9/2001 | Duluk, Jr. |
| 6,289,414 | B1 | 9/2001 | Feldmeier et al. |
| 6,295,576 | B1 | 9/2001 | Ogura et al. |
| 6,298,339 | B1 | 10/2001 | Bjornson |
| 6,308,219 | B1 | 10/2001 | Hughes |
| 6,377,577 | B1 | 4/2002 | Bechtolsheim et al. |
| 6,430,190 | B1 | 8/2002 | Essbaum et al. |
| 6,434,662 | B1 | 8/2002 | Greene et al. |
| 6,804,744 | B1 * | 10/2004 | Abbas .................. 711/108 |

OTHER PUBLICATIONS

Waldvogel et al., "Scalable High Speed IP Routing Lookups," Proc. SIGCOMM '97, ACM, 1997, pp. 25-36.

Lampson et al., "IP Lookups Using Multiway and Multicolumn Search," Proc. Infocom 98, Mar. 1998, 24 pages.

V. Srinivasan and George Varghese, "Faster IP Lookups using Controlled Prefix Expansion," ACM SIGMETRICS Performance Evaluation Review, vol. 26 No. 1, Jun. 1998, p. 1-10.

Stefan Nilsson and Gunnar Karlsson, "Fast Address Look-up for Internet Routers," Proceedings of IEEE Broadband Communications, Apr. 1998, 12 pages.

William N. Eatherton, Hardware-Based Internet Protocol Prefix Lookups, Master's thesis, Sever Institute, Washington University, St. Louis, MO, May 1999, 109 pages.

Lampson et al., "IP Lookups Using Multiway and Multicolumn Search," IEEE Transactions on Networking, vol. 7, No. 3, Jun. 1999, pp. 324-334.

Lockwood et al., "Field Programmable Port Extender (FPX) for Distributed Routing and Queuing," Proceedings of the ACM/SIGDA international symposium on Field programmable gate arrays, Feb. 2000, pp. 137-144.

Ruiz-Sanchez et al., "Survey and Taxonomy of IP Address Lookup Algorithms," IEEE Network Magazine, vol. 15, No. 2, Mar./Apr. 2001, pp. 8-23.

Pankaj Gupta and Nick McKewon, "Algorithms for Packet Classification," IEEE Network Magazine, vol. 15, No. 2, Mar./Apr. 2001, pp. 24-32.

Iyer et al., "ClassiPI: An Architecture for Fast and Flexible Packet Classification," IEEE Network Magazine, vol. 15, No. 2, Mar./Apr. 2001, pp. 33-41.

Waldvogel et al., "Scalable High Speed Prefix Matching," ACM Transactions on Computer Systems, vol. 19, No. 4, Nov. 2001, pp. 440-482.

Devavrat Shah and Pankaj Gupta, "Fast Incremental Updates on Ternary-CAMs for Routing Lookups and Packet Classification," Proc. Hot Interconnects VIII, Aug. 2000, Stanford. IEEE Micro, vol. 21, No. 1, Jan./Feb. 2001, 9 pages.

Waldvogel et al., "Scalable Best Matching Prefix Lookups," PODC 98, ACM 1998.

Radia Perlman, Interconnections: Bridges, Routers, Switches, and Internetworking Protocols, Second Edition, Addison-Wesley, 2000, pp. 347-365.

Pankaj Gupta and Nick McKeown, "Algorithms for Packet Classification," IEEE Network Special Issue, Mar./Apr. 2001, vol. 15, No. 2, pp. 24-32 (reprint 29 pages).

Srinivasan et al., "Packet Classification Using Tuple Space Search," ACM Computer Communication Review, 1999. ACM SIGCOMM'99, Sep. 1999 (12 pages).

Srinivasan et al., "Fast and Scalable Layer Four Switching," ACM Computer Communication Review, 28(4):191-202, 1998. ACM SIGCOMM'98, Sep. 1998 (12 pages).

Stefan Nilsson and Gunnar Karlsson, "IP-Address Lookup Using LC-Tries," IEEE Journal on Selected Areas in Communications, Jun. 1999 (12 pages).

* cited by examiner

INSERT OPERATION

**LOOKUP OPERATION

DELETE OPERATION

PATRICIA SEARCH
OPERATION

PATRICIA LOCATE
PARENT OPERATION

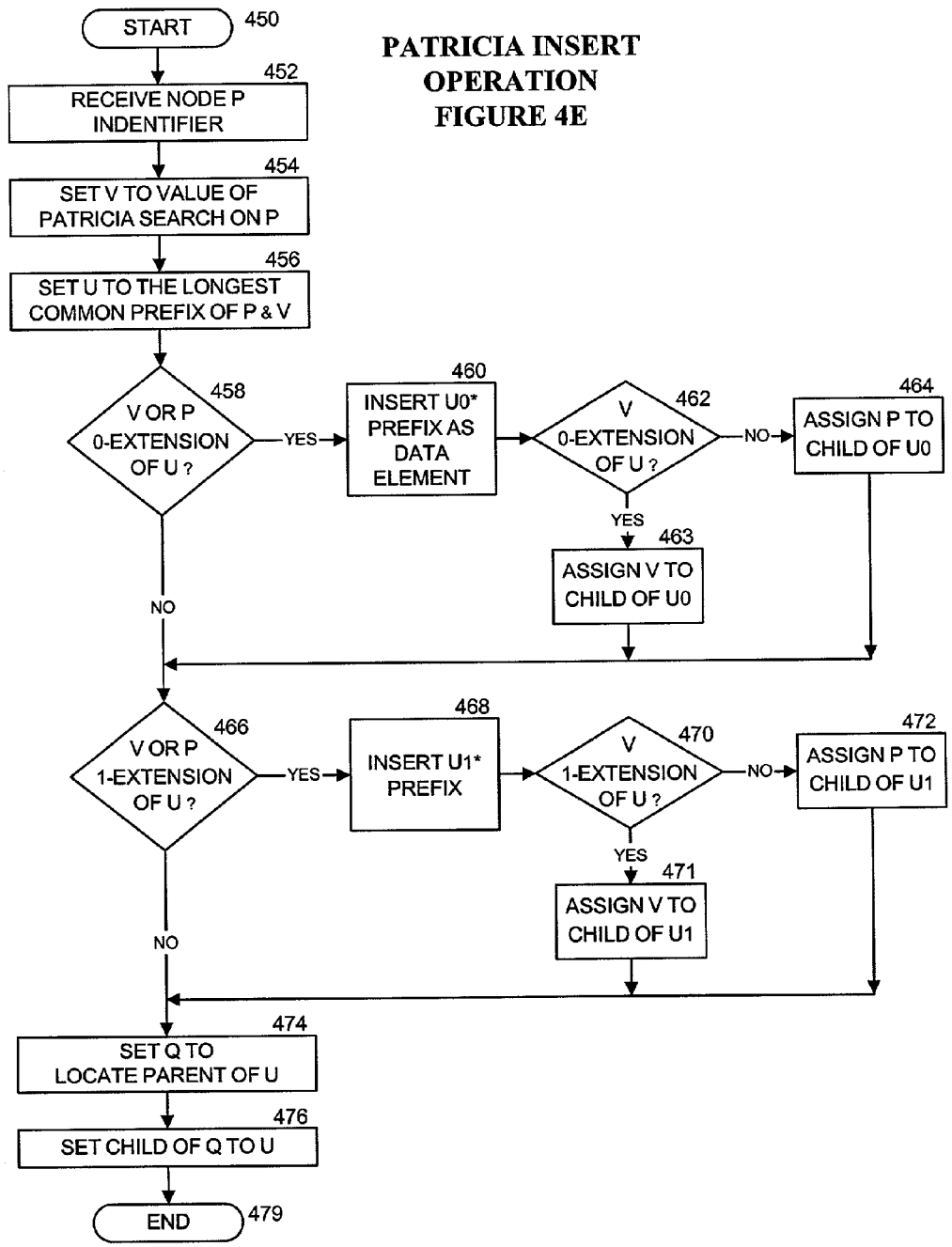

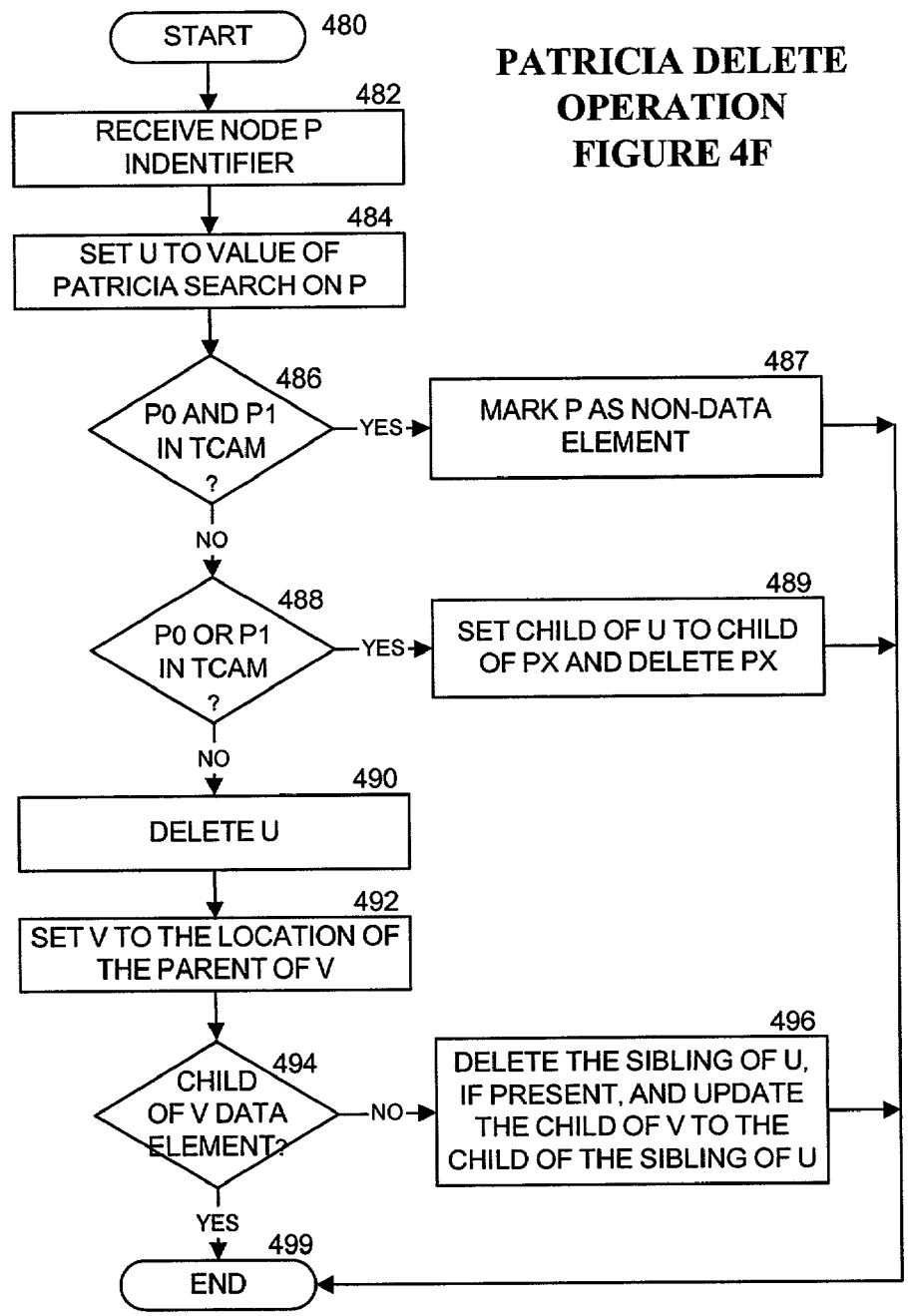

ASSIGNING PREFIXES TO ASSOCIATIVE MEMORY CLASSES BASED ON A VALUE OF A LAST BIT OF EACH PREFIX AND THEIR USE INCLUDING BUT NOT LIMITED TO LOCATING A PREFIX AND FOR MAINTAINING A PATRICIA TREE DATA STRUCTURE

FIELD OF THE INVENTION

This invention especially relates to computer and communications systems, especially network routers and switches; and more particularly, the invention relates to assigning prefixes to associative memory classes based on a value of a last bit of each prefix, and their use, including, but not limited to locating a prefix and for maintaining a Patricia tree data structure.

BACKGROUND OF THE INVENTION

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP).

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs require matching packets on a subset of fields of the packet flow label, with the semantics of a sequential search through the ACL rules. IP forwarding requires a longest prefix match.

Known approaches of packet classification include using custom application-specific integrated circuits (ASICs), custom circuitry, software or firmware controlled processors, binary and ternary content-addressable memories (CAMs). The use of programmable software or firmware have advantages as they provide some level of flexibility, which becomes especially important as new protocols and services are added to existing network. Customers typically desire to use their existing hardware (e.g., routers, switches etc.) to support these new protocols and services. However, known software and firmware implementations are relatively slow, and typically place a performance bound which may be incompatible with new requirements.

A ternary CAM (TCAM) is a special type of fully associative memory which stores data with three logic values: '0', '1' or '*' (don't care). Each TCAM entry includes a value and a mask. These entries are stored in the TCAM in decreasing order of priority, such as in a decreasing order of the length of prefixes. For a given input, the TCAM compares it against all of the entries in parallel, and returns the entry with the highest priority that matches the input lookup word. An entry matches the input lookup word if the input and the entry value are identical in the bits that are not masked out.

When performing prefix inserts, deletes, and route updates, the exact location of the prefix in the TCAM must be known as the location cannot be determined by simply looking up the prefix in the TCAM, because the TCAM in this application is configured to produce a longest prefix match, so there is no guarantee that a lookup operation will produce the desired entry. For example, if a TCAM contains the three entries of "10101011", "10101010", and "1010101*" and the entry "1010101*" is to be deleted, a lookup operation will match either "10101011" or "10101010" rather than produce the location of the desired "1010101*" entry. Thus, a Patricia tree (or another variation of the tree/trie data structure) for prefix updates is stored in memory of the programming mechanism.

Thus, in current implementations, the central processor managing these entries typically maintains a Patricia tree (or trie or some variation thereof) in a memory separate from the TCAM or other associative memory. When a prefix entry is inserted to the TCAM, a pointer is created in the Patricia tree node that points to the TCAM location of the prefix. While deleting a prefix, the Patricia tree is traversed to locate the prefix and find its location in the TCAM. This scheme requires up to L operations and a trie data structure needs to be maintained; where L=maximum prefix length (e.g., L=128 for IPv6). Moreover, it may be expensive to realize this in hardware. For example, in some switches, this scheme requires all TCAMs in the system to have identical prefix entries in each location. Otherwise, for each TCAM, the central processor maintains a pointer to the location of a prefix in that TCAM. In the first case, if there are several line cards with different size TCAMs (say, 64K, 128K, 256K and 512K), then they are all limited to contain only 64K prefix entries. In the second case, in order to delete a route table entry from the system, the central processor sends a message specifically for each TCAM. Alternatively, a trie data structure needs to be maintained with each TCAM.

For the reasons presented herein and/or other reasons, new methods and apparatus are needed for using and updating associative memory entries.

SUMMARY OF THE INVENTION

Methods and apparatus are disclosed for maintaining and using entries in one or more associative memories, such as, but not limited to ternary content-addressable memories (TCAMs). In one embodiment, a last bit of a prefix to be stored in an associative memory entry is checked, and based on this result, the entry is placed into one of two classes of associative memory entries. The entry (e.g., a particular prefix) can then be located within the associative memory by performing a lookup operation using the prefix padded with ones if the last bit of the prefix is zero or with zeros if the last bit is one to fill out the remaining bits of the lookup word. In one embodiment, the entries of different classes of entries are stored in different associative memories. In one embodiment, the entries of different classes of entries are stored in the same associative memory, with each of these entries including a class specific identifier. In one embodiment, these entries are stored in an order to produce a longest prefix match. In one embodiment, these entries correspond to edges of a tree or trie data structure, with children of a edge stored in a corresponding entry in an adjunct memory.

BRIEF DESCRIPTION OF THE DRAWINGS

The appended claims set forth the features of the invention with particularity. The invention, together with its advantages, may be best understood from the following detailed description taken in conjunction with the accompanying drawings of which:

FIGS. 4C-F are flow diagrams used in one embodiment for maintaining and using classes of associative memory entries to store a tree data structure.

DETAILED DESCRIPTION

Figure 1:
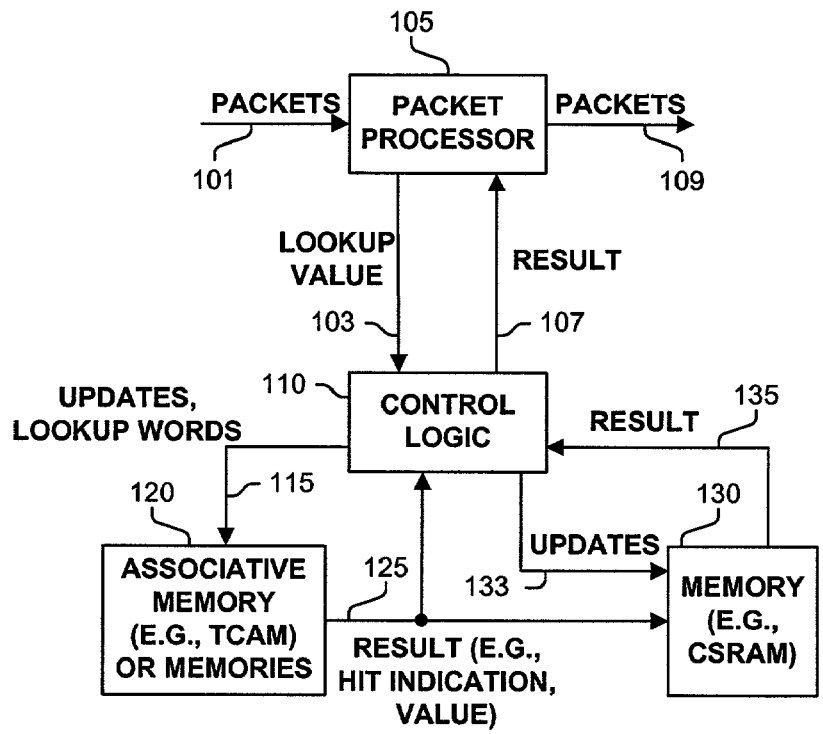
FIG. 1 is a block diagram of one embodiment maintaining and using classes of entries in one or more associative memories.

Systems and methods are disclosed for assigning prefixes to associative memory classes based on a value of a last bit of each prefix, and their use, including, but not limited to locating a prefix and for maintaining a tree data structure. Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable medium containing instructions. The embodiments described hereinafter embody various aspects and configurations within the scope and spirit of the invention, with the figures illustrating exemplary and non-limiting configurations.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or identification of a packet. Moreover, these packets may contain one or more types of information, including, but not limited to, voice, data, video, and audio information. The term "item" is used herein to refer to a packet or any other unit or piece of information or data. The phrases "processing a packet" and "packet processing" typically refer to performing some steps or actions based on the packet, and which may or may not include modifying and/or forwarding the packet.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may be performed in the same or in a different serial or parallel ordering and/or by different components and/or processes, threads, etc., and/or over different connections and be combined with other functions in other embodiments in keeping within the scope and spirit of the invention.

Moreover, the terms "network" and "communications mechanism" are used generically herein to describe one or more networks, communications mediums or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc.

The term "storage mechanism" includes any type of memory, storage device or other mechanism for maintaining instructions or data in any format. "Computer-readable medium" is an extensible term including any memory, storage device, storage mechanism, and other storage and signaling mechanisms including interfaces and devices such as network interface cards and buffers therein, as well as any communications devices and signals received and transmitted, and other current and evolving technologies that a computerized system can interpret, receive, and/or transmit. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed a processing element and/or control logic, and data which is manipulated a processing element and/or control logic. The term "data structure" is an extensible term referring to any data element, variable, data structure, data base, and/or one or more or an organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc. The term "associative memory" refers to all types of known or future developed associative memories, including, but not limited to binary and ternary content-addressable memories, hash tables, TRIE and other data structures, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before the another, but rather provides a mechanism to distinguish between particular units. Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modify or not modifying the coupled signal or communicated information. The term "subset" is used to indicate a group of all or less than all of the elements of a set. Moreover, the term "or" is used herein to identify an alternative selection of one or more, including all, of the conjunctive items.

Methods and apparatus are disclosed for maintaining and using entries in one or more associative memories. In one embodiment, a last bit of a prefix is checked, and based on this result, the entry is placed into one of two classes of associative memory entries. The entry can then be identified within the associative memory by performing a lookup operation using the prefix padded with ones if the last bit of the prefix is zero or with zeros if the last bit is one to fill out the remaining bits of the lookup word. Entries of different classes of entries are typically either stored in different associative memories, or in the same associative memory with each of these entries including a class specific identifier. In one embodiment, among other applications, these entries can be used to locate a prefix and to store a tree data structure in the one or more associative memories.

Methods and apparatus are also disclosed for assigning prefixes to associative memory classes based on a value of a last bit of each prefix. In one embodiment, this allows prefix inserts and deletes to be performed without maintaining a Patricia tree or other data structure in a memory associated with a programming mechanism, as an entry can be readily identified using a single prefix lookup operation.

One embodiment operates as follows. Let lsb(P) denote the least significant or last bit of prefix P, and length(P) denote the number of bits in a prefix that are not masked out. Prefixes are maintained in two associative memory classes: C0 and C1. Prefixes ending in zero are stored in class C0 and prefixes ending in one are stored in class C1. In this manner, each entry within a class is guaranteed to be unique, as well as its location uniquely identifiable based on a single lookup operation. For example, assume P is the prefix that needs to be looked up during an insert, delete or route update operation. If the lsb(P) is zero, then lookup P1 . . . 1 in class C0. If the lsb(P) is one, then lookup P0 . . . 0 in class C1. The result gives the location of P in the associative memory. In one embodiment, each class of entries is stored in a different associative memory. In one embodiment, multiple classes of entries are stored in the same associative memory, with each entry including a class specific identification vector (also referred to herein as a class identifier). In one embodiment, an associative memory lookup operation is performed on each entry class in determining a longest prefix match. In one embodiment, a copy of each of the entries in both classes is stored in an additional associative memory, or in a single associative memory and identified with a different class identifier. A longest prefix match can then be performed with a single lookup operation on this additional associative memory or using the different class identifier.

One embodiment maintains a tree or trie data structure, such as, but not limited to a Patricia tree data structure in one or more associative memories and one or more adjunct memories. In one embodiment, each internal node in a Patricia tree is represented by a prefix obtained by walking from root to that node. For each internal node (prefix P) of Patricia tree, two prefix entries are stored in the associative memory: P0* in class C0 and P1* in class C1. In one embodiment, these entries correspond to edges of the Patricia tree. The left edges are typically stored in class C0 and the right edges in C1 (of course this nomenclature could be reversed.) For example, in one embodiment, the entry P0* represents the left edge emanating from node P and P1* represents the right edge. The corresponding child for each node is maintained in a corresponding adjunct memory location. For example, the left child of P is stored in a memory location corresponding to P0*, and the right child of P is stored in a memory location corresponding to P1*. In one embodiment, these children are also prefixes because they represent Patricia tree nodes. In one embodiment an internal node of the Patricia or other tree could also be an inserted data element, such as if the Patricia tree is viewed as being used as a database of prefixes then a certain prefix maybe both a data element as well as an internal node. In one embodiment, to differentiate between these nodes, a data element flag is maintained in memory corresponding to each entry to indicate whether its child is a data or non-data element. Note, an internal node could also be a data element, and it is also possible that the internal node has only one child.

FIG. 1 illustrates one embodiment of a system, which may be part of a router or other communications or computer system, for assigning prefixes to associative memory classes based on a value of a last bit of each prefix, and their use, including, but not limited to locating a prefix and for maintaining a tree data structure. In one embodiment, control logic 110 programs, updates and performs lookup operations on associative memory or memories 120 with classes of associative memory entries by providing updates and lookup words 115. In one embodiment, control logic 110 includes custom circuitry, such as, but not limited to discrete circuitry, ASICs, memory devices, processors, etc. Control logic 110 also stores results (e.g., nodes, routing information, etc.) via updates 133 in memory or memories 130. A hit result 125 is typically provided to control logic 110 and to memory or memories 130, which produces result 135.

In one embodiment, packets 101 are received by packet processor 105. In addition to other operations (e.g., packet routing, security, etc.), packet processor 105 typically generates one or more items, including, but not limited to one or more netflow identifiers (typically referred to herein as "netflows") based on one or more fields of one or more of the received packets 101 and possibly from information stored in data structures or acquired from other sources. Packet processor 105 typically generates a lookup value 103 which is provided to control logic 110 for deriving a lookup word 115 and performing one or more associative memory lookup operations on associative memory or memories 120. A result 107 (e.g., a next routing hop) is typically returned to packet processor 105, and in response, one or more of the received packets are manipulated and forwarded as indicated by packets 109.

Figure 2:
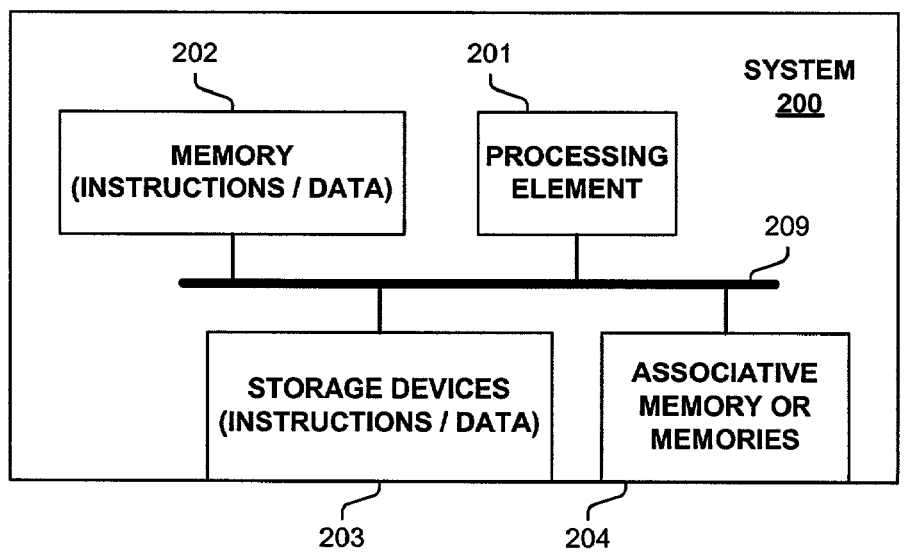
FIG. 2 is a block diagram of one embodiment maintaining and using classes of entries in an associative memory.

FIG. 2 illustrates a system used in one embodiment for assigning prefixes to associative memory classes based on a value of a last bit of each prefix, and their use, including, but not limited to locating a prefix and for maintaining a tree data structure. In one embodiment, system 200 includes a processing element 201, memory 202, storage devices 203, and associative memory or memories 204, which are coupled via one or more communications mechanisms 209 (shown as a bus for illustrative purposes).

Various embodiments of system 200 may include more or less elements. The operation of system 200 is typically controlled by processing element 201 using memory 202 and storage devices 203 to perform one or more tasks or processes, such as programming or performing a lookup operation on associative memory or memories 204. Memory 202 is one type of computer-readable medium, and typically comprises random access memory (RAM), read only memory (ROM), flash memory, integrated circuits, and/or other memory components. Memory 202 typically stores computer-executable instructions to be executed by processing element 201 and/or data which is manipulated by processing element 201 for implementing functionality in accordance with one embodiment of the invention. Storage devices 203 are another type of computer-readable medium, and typically comprise solid state storage media, disk drives, diskettes, networked services, tape drives, and other storage devices. Storage devices 203 typically store computer-executable instructions to be executed by processing element 201 and/or data which is manipulated by processing element 201 for implementing functionality in accordance with one embodiment of the invention.

Figure 3A:
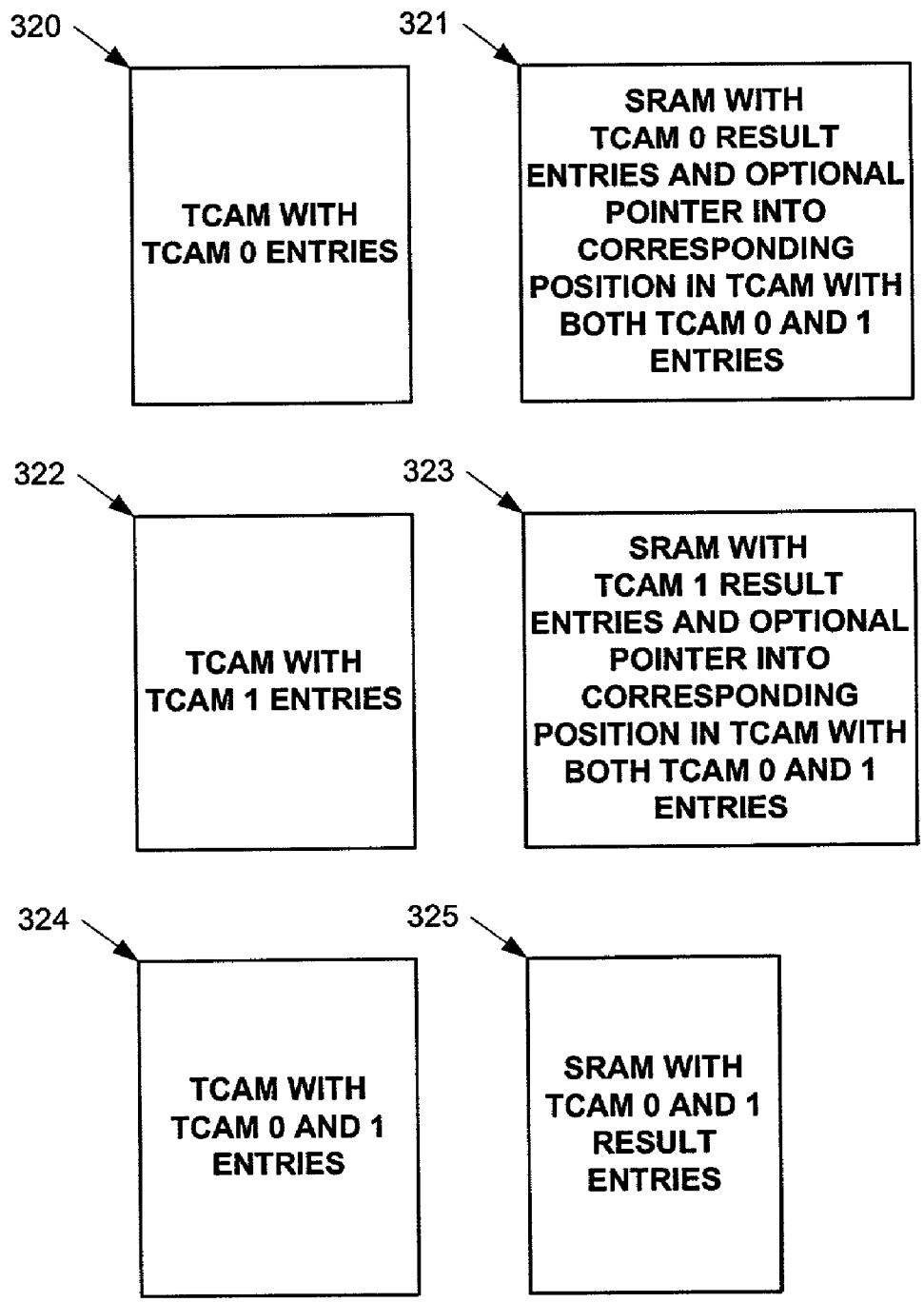
FIG. 3A is a block diagram of associative memory entries used in one embodiment.

FIG. 3A illustrates a configuration of associative memory entries used in one embodiment. TCAM 320 includes class zero associative memory entries and TCAM 322 includes class one associative memory entries. Adjunct SRAM memories 321 and 323 typically are used to store lookup results (e.g., forwarding information, a children nodes, etc.) In one embodiment, an additional TCAM 324 is used to store associative memory entries of both classes, and in this case, SRAMs 321 and 323 typically include a pointer or identifier for each entry for the corresponding associative memory entry in TCAM 324. SRAM memory 325 typically is used to store lookup results corresponding to associative memory entries in TCAM 324.

Figure 3B:
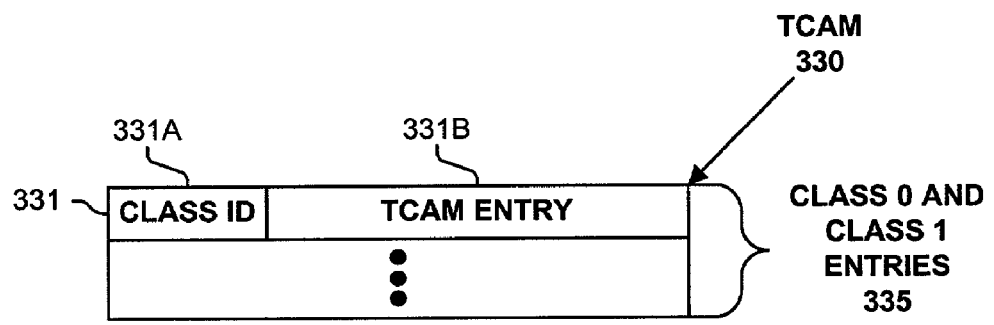
FIG. 3B is a block diagram of associative memory entries used in one embodiment.

FIG. 3B illustrates a TCAM 330 used in one embodiment to store both class zero and class one associative memory entries 335, with each the respective class of each of these entries being identified by a class identification portion 331A with its TCAM entry portion 331B of the stored entry 331.

Figure 3C:
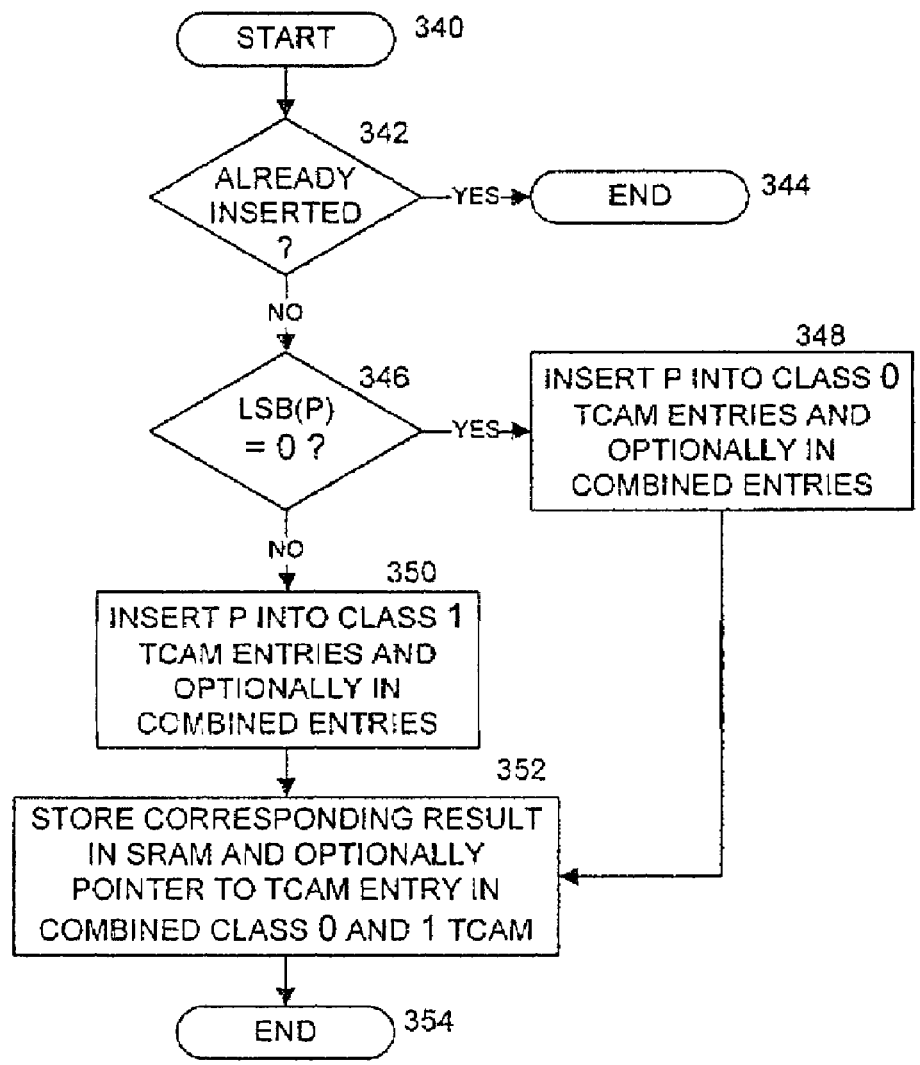
FIGS. 3C-E are flow diagrams used in one embodiment for maintaining and using classes of associative memory entries.

FIG. 3C illustrates a process used in one embodiment to insert a prefix P in one or more associative memories according to its determined associative memory class. Processing begins with process block 340, and proceeds to process block 342. If the entry is already inserted, then processing is complete as indicated by process block 344. Otherwise, as determined in process block 346, if the last bit of the prefix P is zero, then in process block 348, prefix P is inserted into the class zero associative memory entries, either in a separate associative memory or one using class identifiers, and optionally in an associative memory having both classes of entries. Otherwise, in process block 350, prefix P is inserted into the class one associative memory entries, either in a separate associative memory or one using class identifiers, and optionally in an associative memory having both classes of entries. Typically, these entries are stored in the associative memory used to produce a longest prefix match in an order based on the length of the prefix. Next, in process block 352, the corresponding result is stored in the appropriate adjunct memory, which optionally includes a pointer to a location of the corresponding entry in an associative memory having both classes of entries. Processing is complete as indicated by process block 354.

Figure 3D:
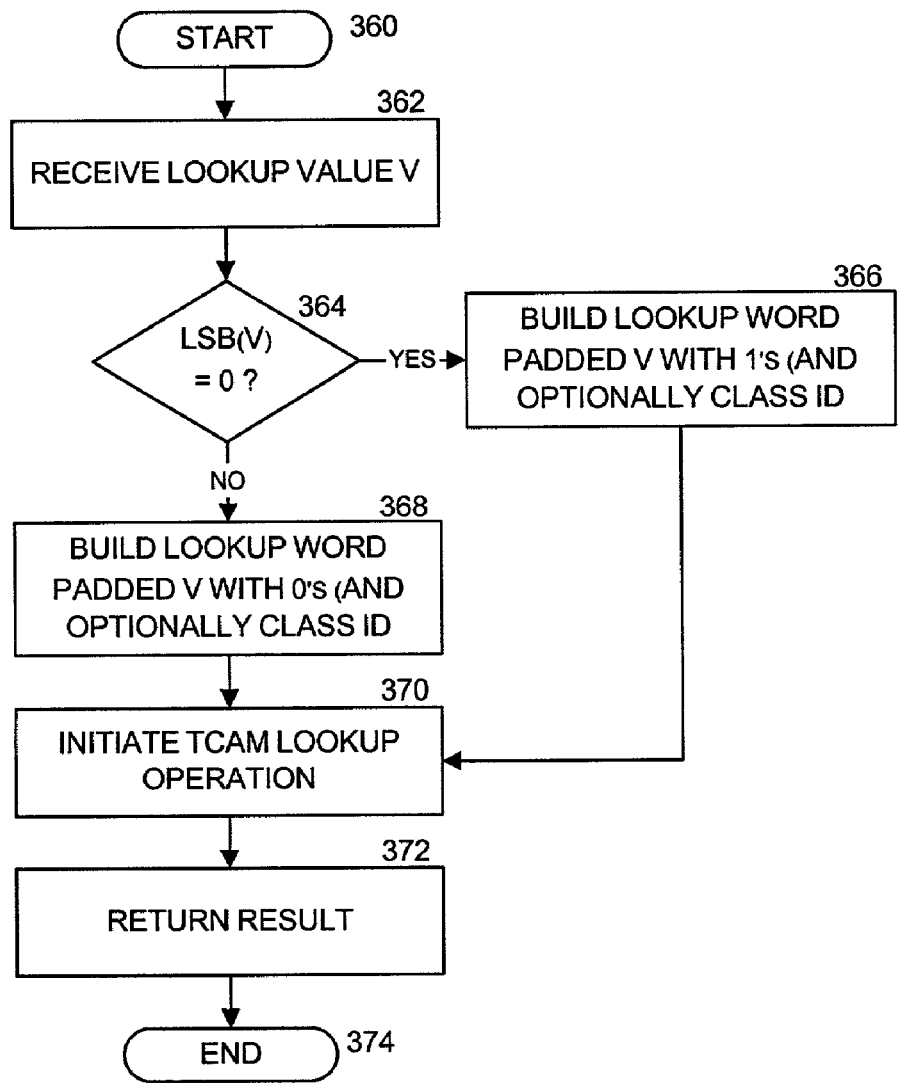

FIG. 3D illustrates a process used in one embodiment to perform a lookup operation. Processing begins with process block 360, and proceeds to process block 362 wherein a lookup value V is received. If the last bit of V is zero as determined in process block 364, then, in process block 366, a lookup word is built using an optional class zero identifier with prefix V padded with ones in the remaining bits of lookup word. Otherwise, in process block 368, a lookup word is built using an optional class one identifier with prefix V padded with ones in the remaining bits of lookup word. Next, in process block 370, the lookup operation is initiated; and in process block 372 the result is returned, such as that produced directly from the associative memory or a memory read operation of an adjunct memory. Processing is complete as indicated by process block 374.

Figure 3E:
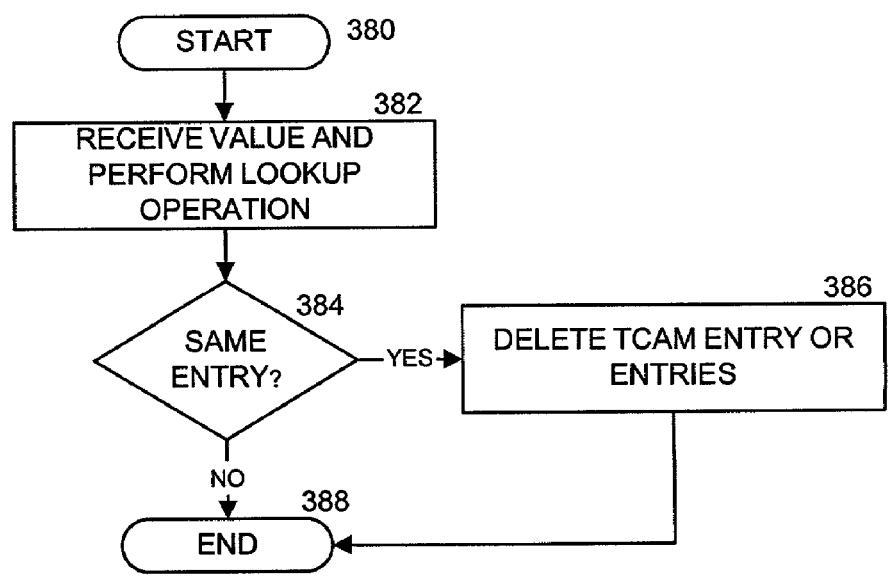

FIG. 3E illustrates a process used in one embodiment to delete a particular entry. Processing begins with process block 380, and proceeds to process block 382, wherein a value is received. A lookup operation is performed on this value, such as via the process illustrated in FIG. 3D. As determined in process block 384, if the received result matches the item desired to be deleted, then, in process block 386, the corresponding associative memory entry or entries are deleted. Processing is complete as indicated by process block 388.

Figure 4A:
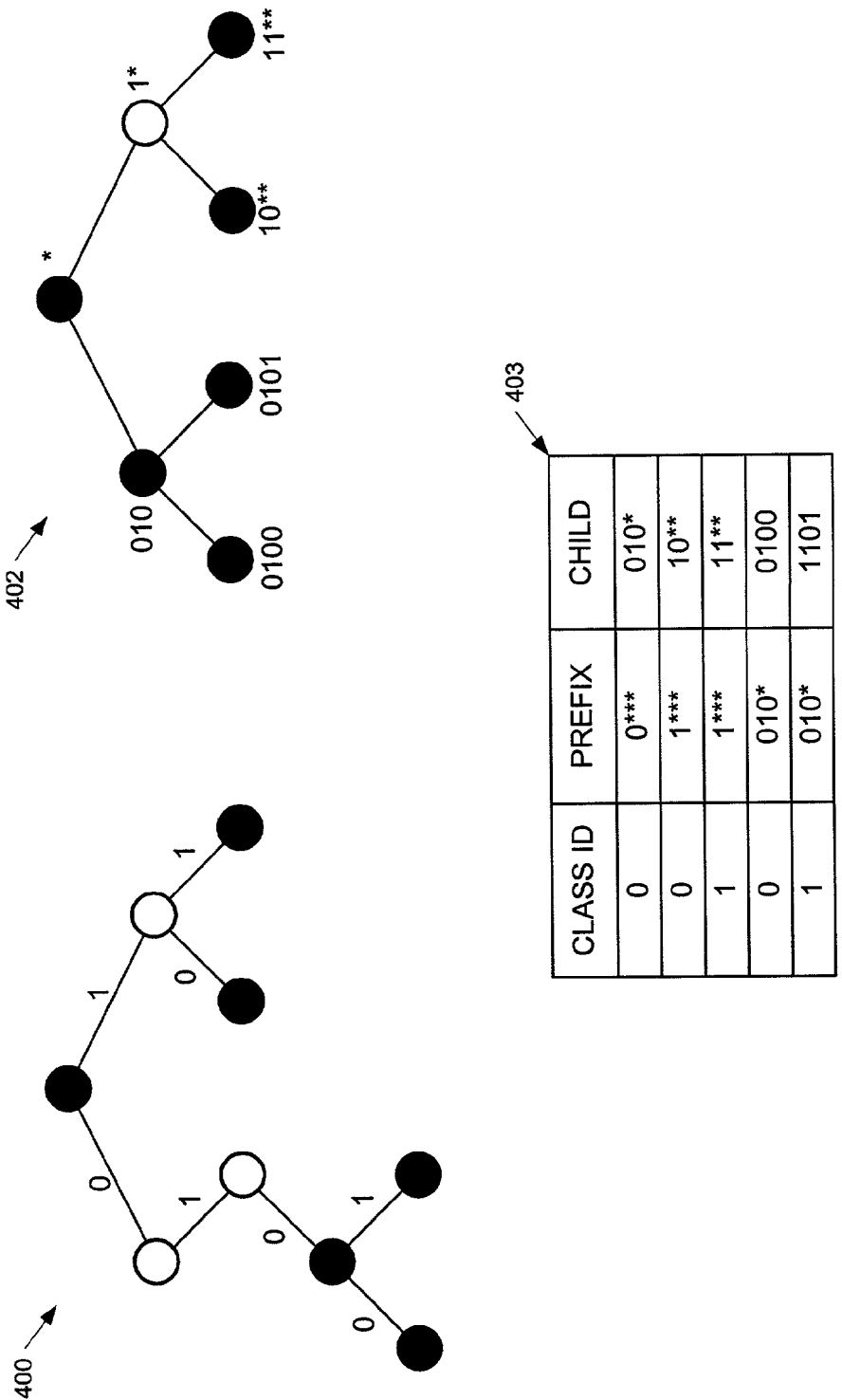
FIG. 4A is a block diagram of an exemplary Patricia tree illustrating prefixes and child nodes.

These and other constructs can be used to maintain and use trees and other data structures. FIG. 4A illustrates an example of a tree 400 stored in one embodiment assigning prefixes to associative memory classes based on a value of a last bit of each prefix. In one embodiment, tree 400 is converted to a Patricia tree 402. Data structure 403, used in one embodiment in programming one or more associative memories, illustrates corresponding class identifiers, prefixes, and children nodes.

Figure 4B:
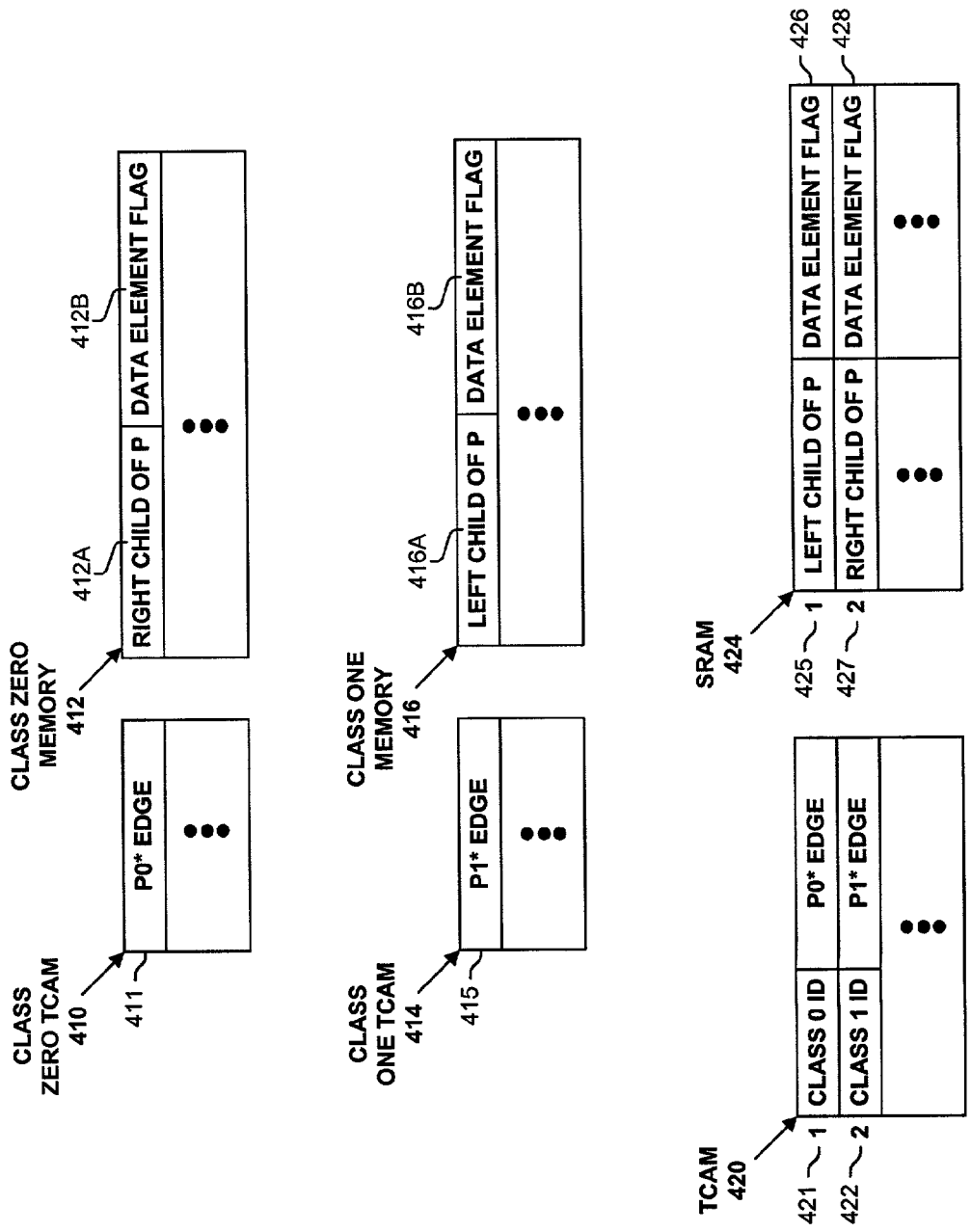
FIG. 4B is a block diagram of data structures used in two different embodiments of an unlimited number of embodiments.

FIG. 4B illustrates configurations of associative memories 410 and 414 and memories 412 and 416 used in one embodiment, and associative memory 420 and memory 424 used in one embodiment. Associative memory 410 is used to store a prefix corresponding to a class zero child edge of prefix P in entry 411, and corresponding right child 412A and data element flag 412B in adjunct memory 412. Associative memory 414 is used to store a prefix corresponding to a class one child edge of prefix P in entry 415, and corresponding left child 416A and data element flag 416B in adjunct memory 416.

Associative memory 420 is used to store both class zero and class one associative memory entries, each having a class specific identifying vector. As illustrated, stored in entry 421 of associative memory 420 is the class zero edge of prefix P and its class zero identifier. At a corresponding location in adjunct memory 424 is the left child 425 of P and a data element flag 426. Stored in entry 422 of associative memory 420 is the class one edge of prefix P and its class one identifier. At a corresponding location in adjunct memory 424 is the right child 427 of P and a data element flag 428.

Figure 4C:
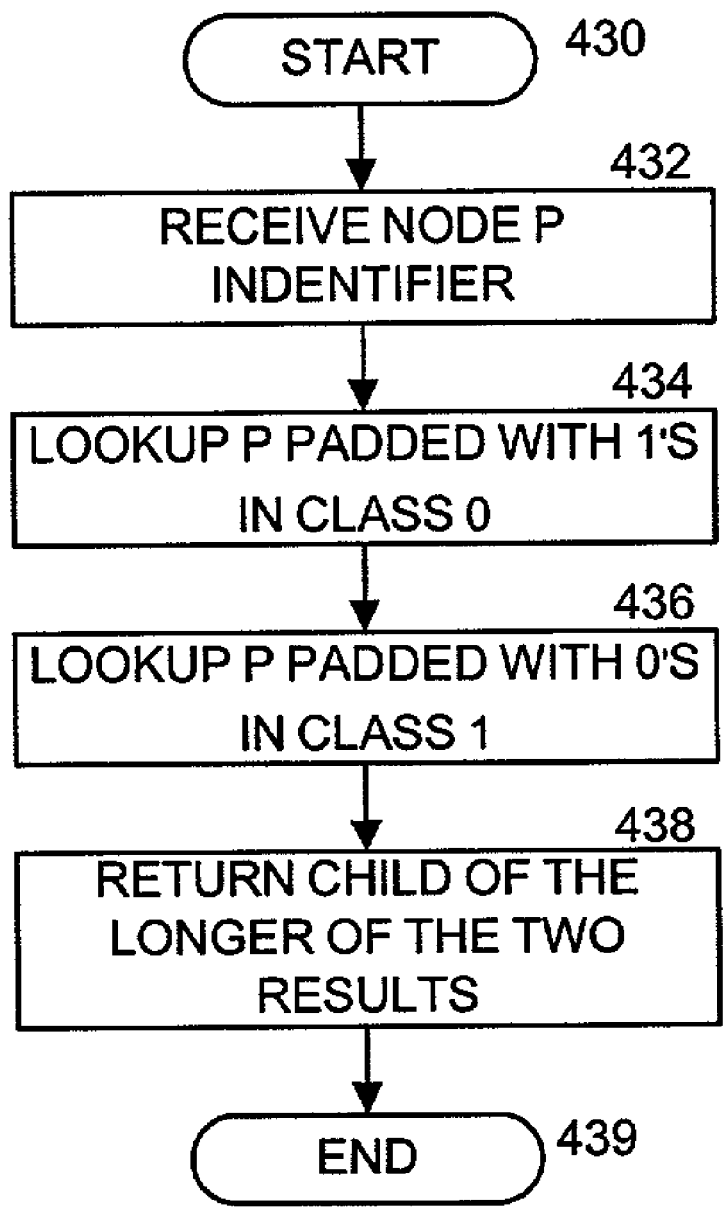

FIG. 4C illustrates a process used in one embodiment to search a Patricia tree to return the element with key P if it is present in the Patricia tree, otherwise it returns one of its neighboring elements in the sorted order. Processing begins with process block 430, and proceeds to process block 432, wherein a node P identifier is received. Next, in process block 434, a lookup word containing P padded with ones is formed, and a lookup operation performed on the class zero entries. In process block 436, a lookup word containing P padded with zeros is formed, and a lookup operation performed on the class one entries. In process block 438, the longer of these two results is returned. Processing is complete as indicated by process block 439.

Figure 4D:
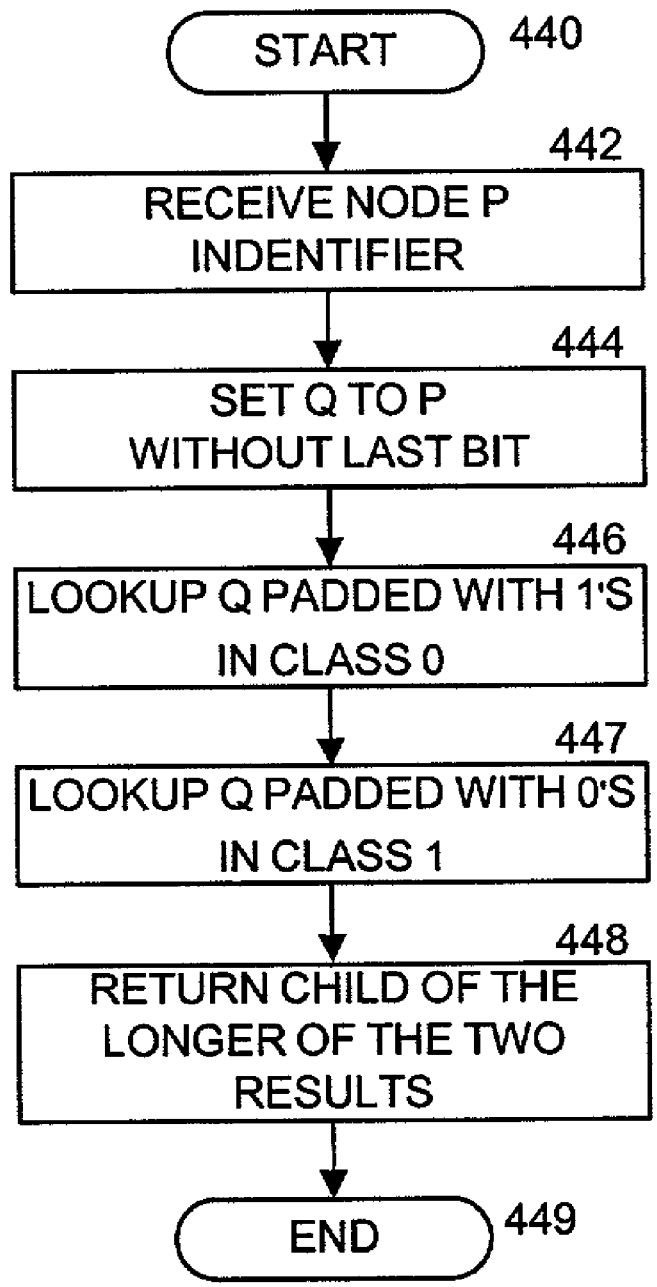

FIG. 4D illustrates a process used in one embodiment to locate a parent of a prefix P. Processing begins with process block 440, and proceeds to process block 442, wherein the node P identifier is received. Next, in process block 444, Q is set to the value of P without its last bit. Next, in process block 446, a lookup word containing Q padded with ones is formed, and a lookup operation performed on the class zero entries. In process block 447, a lookup word containing Q padded with zeros is formed, and a lookup operation performed on the class one entries. In process block 448, the longer of these two results is returned. Processing is complete as indicated by process block 449.

To insert a prefix P in the Patricia tree, basically, in one embodiment, first a Patricia search is performed on the prefix P to be inserted to obtain V. This means while walking from the root to P, the last edge of the tree that was encountered is the edge just above V. To insert P, a new internal node U, which is essentially the longest common prefix of P and V, is created. To create this new internal node U, two entries, U0* and U1*, are inserted into the associative memory. However, if U is directly on the edge above V, then U has only one child namely V. In that case, only one of the entries U0* or U1* is inserted. So, U0* is inserted only if P or V matches U0*. Similarly, U1* is inserted only if P or V matches U1*.

FIG. 4E illustrates a process used in one embodiment to insert a prefix P in the Patricia tree. Processing begins with process block 450, and proceeds to process block 452, wherein the node P identifier is received. Next, in process block 454, V is set to the value returned by a Patricia search operation, such as that illustrated in FIG. 4C, on the node P. In process block 456, the variable U is set to the longest common prefix of P and V.

Next, as determined in process block 458, if V or P is a zero extension of U, then in process block 460, the prefix U0* is inserted as a data element. Then, as determined in process block 462, if V is a zero extension of U, then in process block 463 V is assigned to the child of U0; otherwise, in process block 464, P is assigned to the child of U0.

Next, as determined in process block 466, if V or P is a one extension of U, then in process block 468, the prefix U1* is inserted as a data element. Then, as determined in process block 470, if V is a one extension of U, then in process block 471 V is assigned to the child of U1; otherwise, in process block 472, P is assigned to the child of U1.

Next, in process block 474, Q set to the value returned by a locate parent operation, such as by that illustrated in FIG. 4D, of U. In process block 476, the child of Q is set to U. Processing is complete as indicated by process block 479.

FIG. 4F illustrates a process used in one embodiment to delete a node. Processing begins with process block 480, and proceeds to process block 482, wherein an identifier of node P is received. Next, in process block 484, U is set to the value returned by a Patricia search operation, such as that illustrated in FIG. 4C, on P. As determined in process block 486, if both P0 and P1 are present in the associative memory or memories, then in process block 487, P is marked as a non-data element. Otherwise, as determined in process block 488, if only one of P0 or P1 is present, then in process block 489, the child of U is set to the child of the present node and the present node is removed from the associative memory or memories.

Otherwise, in process block 490, U is deleted from the associative memory or memories. In process block 492, V is set to the location of the parent of V, such as that derived using the process illustrated in FIG. 4D. As determined in process block 494, if the child of V is not a data element, then in process block 496, the sibling of U, if present, is deleted, and the child of V is updated to be the child of the sibling of U. Processing is complete as indicated by process block 499.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method comprising:
    determining a state of a last bit of a storage prefix to be stored in an entry of a class zero associative memory or a class one associative memory;
    providing the storage prefix to the class zero associative memory for storage therein if the state was determined to be a zero, or to the class one associative memory for storage therein if the state was determined to be a one; and
    receiving a lookup prefix;
    determining a value of a last bit of the lookup prefix; and
    padding the lookup prefix with each of any remaining bit positions of an associative memory lookup word padded with either (a) ones to the class zero associative memory or (b) zeros to the class one associative memory.

2. The method of claim 1, comprising initiating a lookup operation using said padded associative memory lookup word on (a) the class zero associative memory if the value is zero or (b) the class one associative memory if the value is one.

3. The method of claim 2, comprising receiving a lookup result indicating the position of the storage prefix.

4. The method of claim 3, wherein the storage prefix equals the lookup prefix.

5. The method of claim 1, comprising:
storing a right child prefix of the prefix in a first memory entry; and
storing a left child prefix of the prefix in a second memory entry.

6. The method of claim 5, comprising storing a first data element identifier corresponding to the right child prefix; and
storing a second data element identifier corresponding to the left child prefix.

7. A method comprising:
determining a state of a last bit of a storage prefix to be stored in an entry of an associative memory;
providing to the associative memory the storage prefix and a class identifier of either (a) a first state if the state was determined to be a zero or (b) a second state if the state was determined to be a one; and
receiving a lookup prefix;
determining a value of a last bit of the lookup prefix; and
providing, in order to identify a matching position in the associative memory, to the associative memory as its lookup word either: (a) if the value was determined to be zero, the class identifier having the first state and the lookup prefix with each of any remaining bit positions of an associative memory lookup word padded with ones, or (b) if the value was determined to be one, the class identifier having the second state and the lookup prefix with each of any remaining bit positions of the associative memory lookup word padded with zeros.

8. The method of claim 7, wherein the storage prefix equals the lookup prefix.

9. The method of claim 7, further comprising:
storing a right child prefix of the prefix in a first memory entry; and
storing a left child prefix of the prefix in a second memory entry.

10. The method of claim 9, further comprising storing a first data element identifier corresponding to the right child prefix; and
storing a second data element identifier corresponding to the left child prefix.

11. An apparatus comprising:
a class zero associative memory including a plurality of class zero associative memory entries, each of the plurality of class zero associative memory entries including a prefix ending in zero;
a class one associative memory including a plurality of class one associative memory entries, each of the plurality of class one associative memory entries including a prefix ending in one;
control logic, coupled to the class zero and the class one associative memory memories, the control logic configured to receive a lookup prefix, to determine a value of a last bit of the lookup prefix, to generate a lookup word including the lookup prefix with each of any remaining bit positions padded with either ones if the value is zero or zeros if the value is one, and to initiate a lookup operation on the class zero associative memory using the lookup word if the value is zero, or to initiate a lookup operation on the class one associative memory using the lookup word if the value is one.

12. The apparatus of claim 11, further comprising:
a class zero memory coupled to the class zero associative memory; and
a class one memory coupled to the class one associative memory;
wherein prefixes stored in the class zero and class one associative memory entries correspond to edges of a tree, and the control logic is further configured to store a left child of a particular one of said prefixes in the class zero memory and a right child of the particular one of said prefixes in the class one memory.

13. The apparatus of claim 12, wherein the class zero memory includes a left child data element identifier corresponding to the left child; and
wherein the class one memory includes a right child data element identifier corresponding to the right child.

14. The apparatus of claim 12, wherein the tree is a Patricia tree.

15. An apparatus comprising:
means for determining a state of a last bit of a storage prefix to be stored in an entry of a class zero associative memory or a class one associative memory;
means for providing the storage prefix to the class zero associative memory for storage therein if the state was determined to be a zero, or to the class one associative memory for storage therein if the state was determined to be a one; and
means for receiving a lookup prefix;
means for determining a value of a last bit of the lookup prefix; and
means for padding the lookup prefix with each of any remaining bit positions of an associative memory lookup word padded with either (a) ones to the class zero associative memory or (b) zeros to the class one associative memory.

16. The apparatus of claim 15, further comprising means for initiating a lookup operation on (a) the class zero associative memory if the value is zero or (b) the class one associative memory if the value is one.

17. The apparatus of claim 15, wherein a plurality of entries stored in the class zero and class one associative memories comprise a tree; and
wherein the apparatus further comprises means for storing children prefixes of the prefix in one or more memories.

18. The apparatus of claim 17, further comprising means for storing data elements corresponding to said children prefixes.

19. The apparatus of claim 18, further comprising means for searching for a particular node of the tree stored in the class zero or class one associative memory.

20. The apparatus of claim 18, further comprising means for locating a parent prefix of one of said children prefixes.

21. The apparatus of claim 18, further comprising means for inserting a particular node in the tree.

22. The apparatus of claim 18, further comprising means for deleting a particular node from the tree.

23. The apparatus of claim 17, wherein the tree is a Patricia tree.

24. An apparatus comprising:
an associative memory including a plurality of class zero entries and a plurality of class one entries, each of the class zero entries including a class zero identifier and a prefix ending in zero, each of the class one entries including a class one identifier and a prefix ending in one; and
control logic coupled to the associative memory;

wherein the control logic is configured to receive a lookup prefix, to determine a value of a last bit of the lookup prefix, and to generate a lookup word including (a) if the value was determined to be zero, the class zero identifier and the lookup prefix with each of any remaining bit positions of an associative memory lookup word padded with ones, or (b) if the value was determined to be one, the class one identifier and the lookup prefix with each of any remaining bit positions of the associative memory lookup word padded with zeros.

25. The apparatus of claim 24, further comprising a memory coupled to the associative memory; and wherein prefixes stored in the class zero and class one entries correspond to edges of a tree, and the control logic is further configured to store a left child of a particular one of said prefixes in the memory in a position corresponding to a class zero entry, and a right child of the particular one of said prefixes in a second position corresponding to a class one entry.

26. The apparatus of claim 25, where the memory includes a data element identifier for each child stored therein.

27. The apparatus of claim 25, wherein the tree is a Patricia tree.

28. An apparatus comprising:

means for determining a state of a last bit of a storage prefix to be stored in an entry of an associative memory;

means for providing to the associative memory the storage prefix and a class identifier of either (a) a first state if the state was determined to be a zero or (b) a second state if the state was determined to be a one; and means for receiving a lookup prefix;

means for determining a value of a last bit of the lookup prefix; and means for providing, in order to identify a matching position in the associative memory, to the associative memory as its lookup word either: (a) if the value was determined to be zero, the class identifier having the first state and the lookup prefix with each of any remaining bit positions of an associative memory lookup word padded with ones, or (b) if the value was determined to be one, the class identifier having the second state and the lookup prefix with each of any remaining bit positions of the associative memory lookup word padded with zeros.

29. The apparatus of claim 28, wherein the matching position is the position of the storage prefix when the storage prefix equals the lookup prefix.

30. The apparatus of claim 28, wherein a plurality of entries stored in the class zero and class one associative memories comprise a tree; and wherein the apparatus further comprises means for storing children prefixes of the prefix in one or more memories.

31. The apparatus of claim 30, further comprising means for storing data elements corresponding to said children prefixes.

32. The apparatus of claim 31, further comprising means for searching for a particular node of the tree stored in the class zero or class one associative memory.

33. The apparatus of claim 31, further comprising means for locating a parent prefix of one of said children prefixes.

34. The apparatus of claim 31, further comprising means for inserting a particular node in the tree.

35. The apparatus of claim 31, further comprising means for deleting a particular node from the tree.

36. The apparatus of claim 30, wherein the tree is a Patricia tree.

37. A method for use with one or more associative memories including a plurality of class zero associative memory entries and a plurality of class one associative memory entries, the method comprising storing a storage prefix in an entry of: (a) the plurality of class zero associative memory entries if the last bit of the storage prefix is a zero, or (b) the plurality of class one associative memory entries if the last bit of the storage prefix is a one; and performing a longest matching prefix operation, in order to identify a position of the storage prefix subsequent to said storing operation, on either: (a) the class zero associative memory entries with a lookup word including the storage prefix padded with ones if the last bit of the storage prefix is zero, or (b) the class one associative memory entries with a lookup word including the storage prefix padded with zeros if the last bit of the storage prefix is one.

38. The method of claim 37, wherein each of said one or more associative memories are a ternary content-addressable memory (TCAM); and wherein the storage prefix is stored in the plurality of class zero associative memory entries or in the plurality of class one associative memory entries in a position based on the length of the storage prefix.

39. An apparatus comprising one or more processors and memory, wherein the memory stores one or more instructions that, when executed by said one or more processors, perform operations for use with one or more associative memories including a plurality of class zero associative memory entries and a plurality of class one associative memory entries, said operations comprising:

storing a storage prefix in an entry of: (a) the plurality of class zero associative memory entries if the last bit of the storage prefix is a zero, or (b) the plurality of class one associative memory entries if the last bit of the storage prefix is a one; and performing a longest matching prefix operation, in order to identify a position of the storage prefix subsequent to said storing operation, on either: (a) the class zero associative memory entries with a lookup word including the storage prefix padded with ones if the last bit of the storage prefix is zero, or (b) the class one associative memory entries with a lookup word including the storage prefix padded with zeros if the last bit of the storage prefix is one.

* * * * *